(12) United States Patent
Zheng (10) Patent No.: US 10,331,617 B2
(45) Date of Patent: Jun. 25, 2019

(54) SERVER

(71) Applicant: Jabil Inc., St. Petersburg, FL (US)

(72) Inventor: Fengquan Zheng, St. Petersburg, FL (US)

(73) Assignee: Jabil Inc., St. Petersburg, FL (US)

(*) Notice: Subject to any disclaimer, the term of this patent is extended or adjusted under 35 U.S.C. 154(b) by 0 days.

(21) Appl. No.: 15/994,646

(22) Filed: May 31, 2018

(65) Prior Publication Data

US 2019/0163669 A1 May 30, 2019

(30) Foreign Application Priority Data

Nov. 30, 2017 (CN) .......................... 2017 1 1236737

(51) Int. Cl.
*H05K 7/14* (2006.01)
*G06F 15/78* (2006.01)

(52) U.S. Cl.
CPC ....... *G06F 15/7867* (2013.01); *H05K 7/1417* (2013.01); *H05K 7/1429* (2013.01); *H05K 7/1445* (2013.01)

(58) Field of Classification Search
CPC ... H05K 7/1429; H05K 7/1417; H05K 7/1445
See application file for complete search history.

(56) References Cited

U.S. PATENT DOCUMENTS

| 6,392,142 | B1* | 5/2002 | Uzuka | H05K 1/14 |
| | | | | 174/541 |
| 7,281,063 | B2* | 10/2007 | Benson | G06F 13/409 |
| | | | | 361/679.33 |
| 7,299,495 | B2* | 11/2007 | King | G06F 1/183 |
| | | | | 709/220 |
| 9,167,725 | B2* | 10/2015 | Chen | H05K 7/20718 |
| 2002/0181194 | A1* | 12/2002 | Ho | G06F 13/409 |
| | | | | 361/756 |

* cited by examiner

*Primary Examiner* — William H. Mayo, III
*Assistant Examiner* — Hiram E Gonzalez
(74) *Attorney, Agent, or Firm* — Young Basile Hanlon & MacFarlane, P.C.

(57) ABSTRACT

A server includes an adapter device, multiple storage modules and multiple controllers. The adapter device includes a base circuit board having opposite first and second surfaces, multiple first connectors disposed on the first surface along a first direction and connected to the base circuit board, and multiple second connectors disposed on the second surface along the first direction in pairs, each of which is arranged along a second direction, is connected to the base circuit board and is disposed between adjacent two of the first connectors. Each of the storage modules is connected to a corresponding first connector. Each of the controllers is connected to a corresponding second connector.

16 Claims, 10 Drawing Sheets

SERVER

CROSS-REFERENCE TO RELATED APPLICATION

This application claims priority of Chinese Invention Patent Application No. 201711236737.3, filed on Nov. 30, 2017.

FIELD

The disclosure relates to a server, and more particularly to a server including an adapter device including first and second connectors for being respectively and electrically connected to storage modules and storage controller modules.

BACKGROUND

Figure 1:
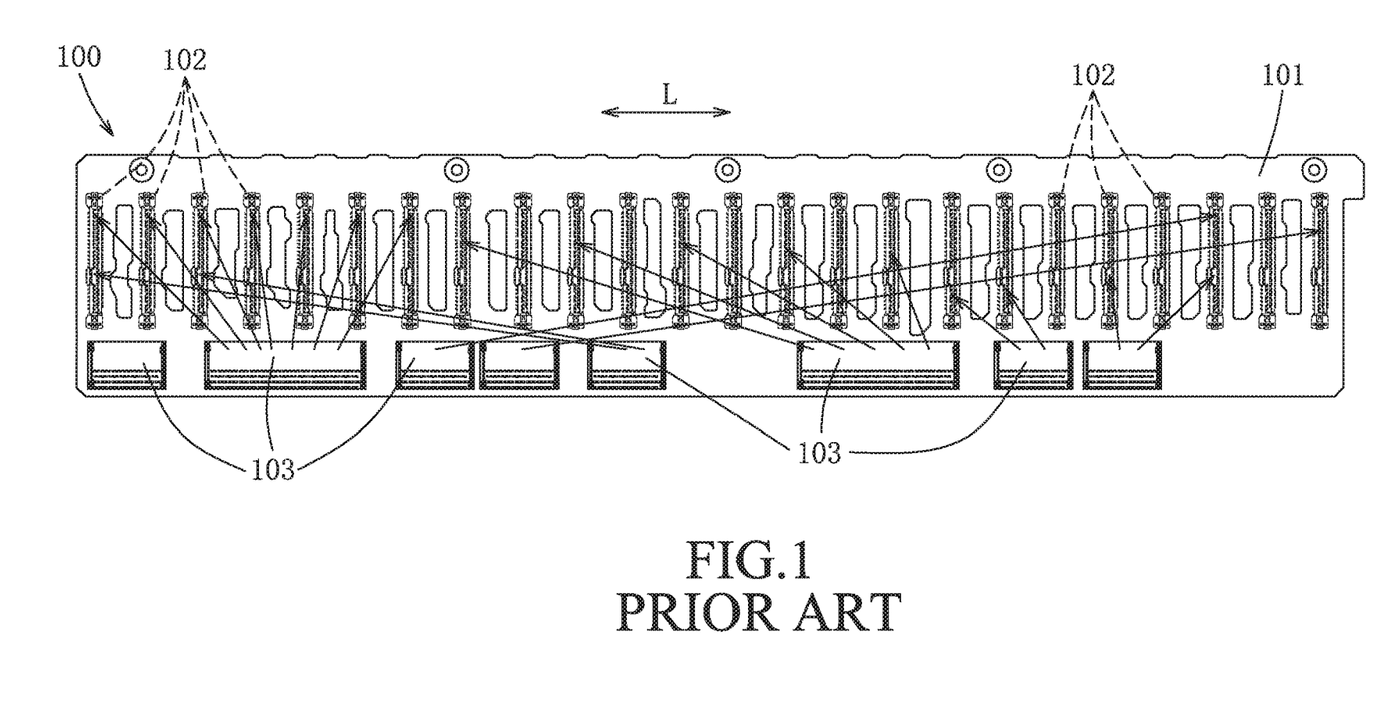
FIG. 1 is a schematic view of a conventional server, showing interconnection between hard disk connectors and high speed connectors through a circuit board.

With recent advancement of storage technologies, the data storage capability of a server has increased as well. Referring to FIG. 1, a conventional server 100 includes a plurality of hard disk drives (e.g., solid state drives, not shown), two storage controller modules (not shown), and a circuit board 101 to which the hard disk drives and the storage controller modules are mounted. The conventional server 100 further includes a plurality of hard disk connectors 102 that are mounted to one side of the circuit board 101, that are electrically connected to the circuit board 101 and that are arranged along a longitudinal direction (L) of the circuit board 101, and a plurality of high speed connectors 103 that are mounted to an opposite side of the circuit board 101, that are electrically connected to the circuit board 101 and that are arranged along the longitudinal direction (L) and adjacent to a bottom side of the circuit board 101. Each of the hard disk drives is electrically connected to a corresponding one of the hard disk connectors 102. The high speed connectors 103 are arranged into two left and right groups that are respectively and electrically connected to the storage controller modules. Each of the high speed connectors 103 is electrically connected to corresponding ones of the hard disk connectors 102 through the circuit board 101 (as shown by the arrows of FIG. 1). Such arrangement requires the circuit board 101 to be formed with multiple staggered layers of interconnects to avoid short circuit among the interconnects. Moreover, such interconnection arrangement may suffer from noise due to interaction among the interconnects. The abovementioned issues are especially prominent in non-volatile memory express (NVMe) interface because there are more than twice the number of the interconnects compared to its precedent, serial attached small computer system interface (SCSI) (abbreviated to SAS).

SUMMARY

Therefore, an object of the disclosure is to provide a server that can alleviate at least one of the drawbacks of the prior art.

According to a first aspect of the present disclosure, a server includes an adapter device, a plurality of storage modules and a plurality of controllers.

The adapter device includes a base circuit board, a plurality of spaced-apart first connectors and a plurality of second connectors. The base circuit board extends along a first direction, and has a first surface and a second surface opposite to the first surface. The first connectors are disposed on the first surface along the first direction and are electrically connected to the base circuit board. Each of the first connectors extends along a second direction that is perpendicular to the first direction. The second connectors are disposed on the second surface in pairs, which are spaced apart along the first direction. Each pair of the second connectors is arranged along the second direction, is electrically connected to the base circuit board and is disposed between adjacent two of the first connectors. Each of the storage modules is electrically connected to a corresponding one of the first connectors. Each of the controllers is electrically connected to a corresponding one of the second connectors and is operable to control a corresponding one of the storage modules.

According to a second aspect of the present disclosure, another server includes a base circuit board, a plurality of spaced-apart first connectors, a plurality of spaced-apart narrow connectors, a case, a plurality of storage modules and a plurality of controllers.

The base circuit board has a front surface and a rear surface. The first connectors are disposed on the front surface of the base circuit board, and are electrically connected to the base circuit board. The narrow connectors are disposed on the rear surface of the base circuit board. Each of the narrow connectors is disposed between adjacent two of the first connectors, and is electrically connected to the base circuit board. The storage modules are received in the case. Each of the storage modules is electrically connected to a corresponding one of the first connectors. The controllers are received in the case. Each of the controllers is electrically connected to a corresponding one of the narrow connectors, and is operable to control a corresponding one of the storage modules.

According to a third aspect of the present disclosure, yet another server includes a base circuit board, a plurality of first connectors, multiple pairs of second connectors, a case, a plurality of storage modules and a plurality of controllers.

The base circuit board has a front surface and a rear surface. The first connectors are spaced apart from each other on the front surface of the base circuit board, and are electrically connected to the base circuit board. Each pair of the second connectors is disposed on the rear surface of the base circuit board between adjacent two of the first connectors. The storage modules are received in the case. Each of the storage modules is electrically connected to a corresponding one of the first connectors. The controllers are received in the case. Each of the controllers is electrically connected to a corresponding one of the second connectors and is operable to control a corresponding one of the storage modules. At least one pair of the second connectors is electrically connected to the adjacent two of the first connectors through the base circuit board.

BRIEF DESCRIPTION OF THE DRAWINGS

Other features and advantages of the disclosure will become apparent in the following detailed description of the embodiment and variation with reference to the accompanying drawings, of which.

DETAILED DESCRIPTION

Before the disclosure is described in greater detail, it should be noted that where considered appropriate, reference numerals or terminal portions of reference numerals have been repeated among the figures to indicate corresponding or analogous elements, which may optionally have similar characteristics.

Figure 2:
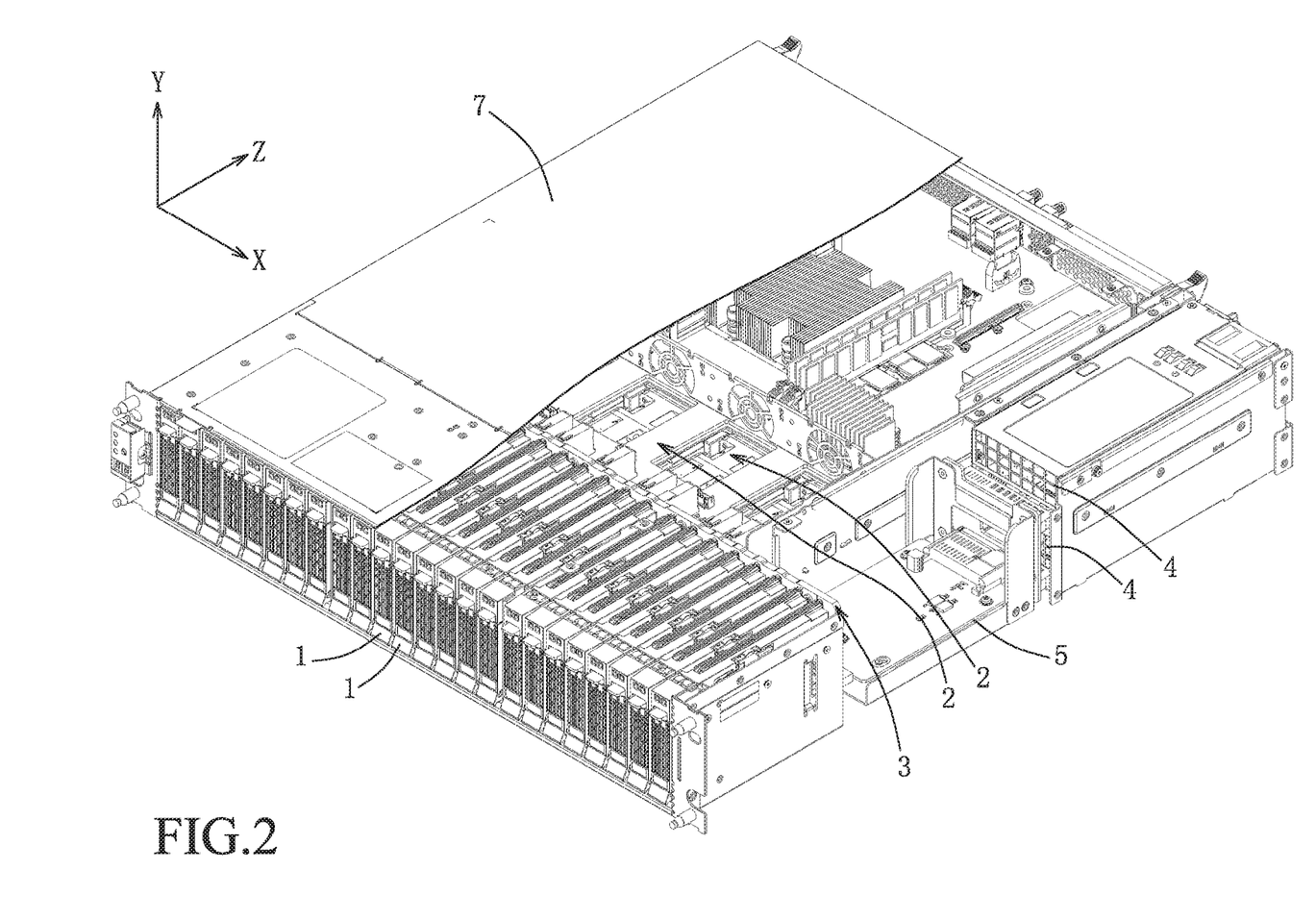
FIG. 2 is a front perspective view of an embodiment of a server according to the present disclosure with a partially-removed case.
Figure 3:
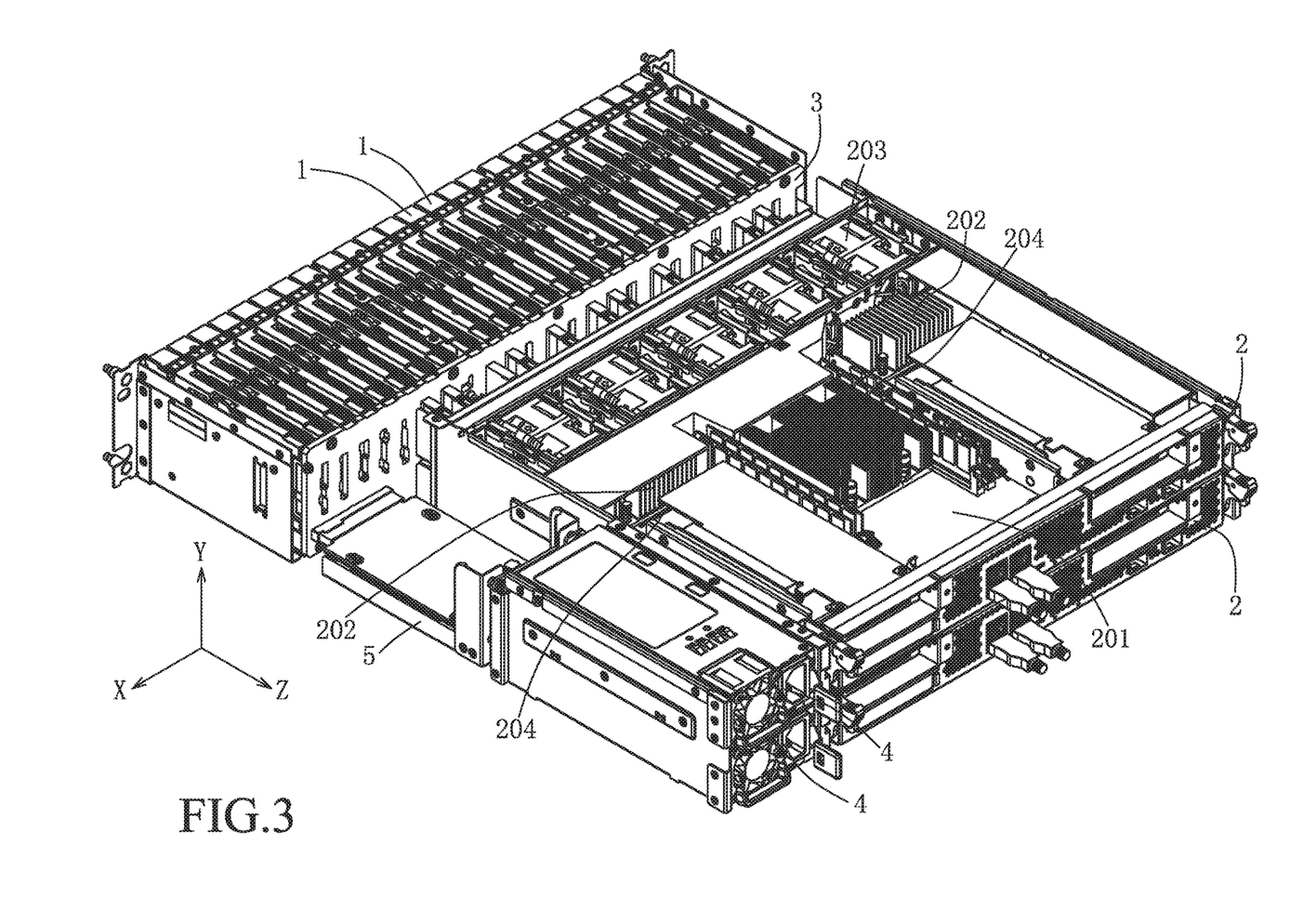
FIG. 3 is a rear perspective view of the embodiment, with the case wholly removed.

Referring to FIGS. 2 and 3, an embodiment of a server according to the present disclosure includes a case 7. The server further includes a plurality of storage modules 1, two storage controller modules 2, an adapter device 3, two power modules 4 and a power expander board 5, all of which are received in the case 7. As shown in FIGS. 2 and 3, the storage modules 1 are arranged along a first direction (X) and at a front side of the adapter device 3, and the storage controller modules 2 are arranged at a rear side of the adapter device 3 and spaced apart from the storage modules 1 in a third direction (Z) that is perpendicular to the first direction (X). Each of the storage controller modules 2 includes a plurality of controllers 204 that are used for controlling the storage modules 1. In this embodiment, the number of the controllers 204 is two. The storage modules 1 are electrically connected to the storage controller modules 2 via the adapter device 3. The power modules 4 are stacked along a second direction (Y) that is perpendicular to the first direction (X) and the third direction (Z), and are electrically connected to the adapter device 3 via the power expander board 5. In this embodiment, the case 7 of the server is configured to occupy two rack units (2U) defined as upper and lower rack units in the disclosure, and the storage controller modules 2 are respectively received in the upper and lower rack units. Each of the storage controller modules 2 includes a main circuit board 201, a central processing unit (not shown), two heat dissipaters 202, a fan 203 and an interface card for electrically connecting with other devices (not shown). The storage controller modules 2 are also stacked along the second direction (Y), and each of the storage controller modules 2 is received in a corresponding rack unit. The controllers 204 are respectively mounted to the main circuit boards 201 of the storage controller modules 2, and are respectively connected to the heat dissipaters 202 for heat dissipation.

Referring further to FIGS. 4 to 7, the adapter device 3 (i.e., backplane) includes a base circuit board 31, a plurality of spaced-apart first connectors 32, a plurality of second connectors 33 and a power connector 34. In this embodiment, the dimension of the base circuit board 31 is configured to be 2U to accommodate the stacked storage controller modules 2. The adapter device 3 is used for electrical connection between the storage modules 1 and the storage controller modules 2 so that the storage modules 1 and the storage controller modules 2 are hot pluggable. The base circuit board 31 extends along the first direction (X), and has a first surface 311, a second surface 312 opposite to the first surface 311, a plurality of first venting holes 313 each extending through the first and second surfaces 311, 312, and a plurality of second venting holes 314 each extending through the first and second surfaces 311, 312. In this embodiment, the first surface 311 is a front surface, and the second surface 312 is a rear surface.

Figure 4:
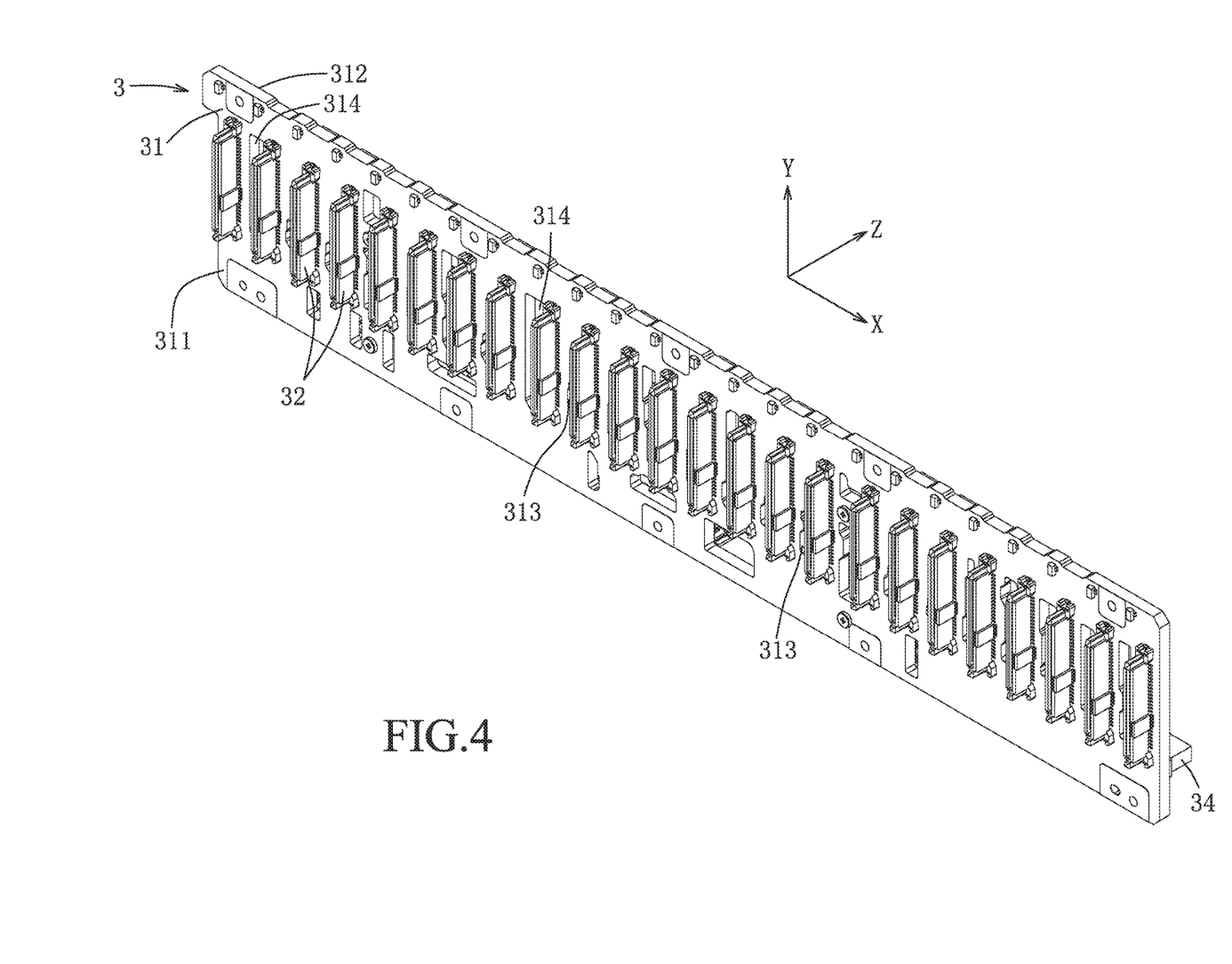
FIG. 4 is a front perspective view of an adapter device of the embodiment, showing a first surface of a base circuit board of the adapter device.
Figure 6:
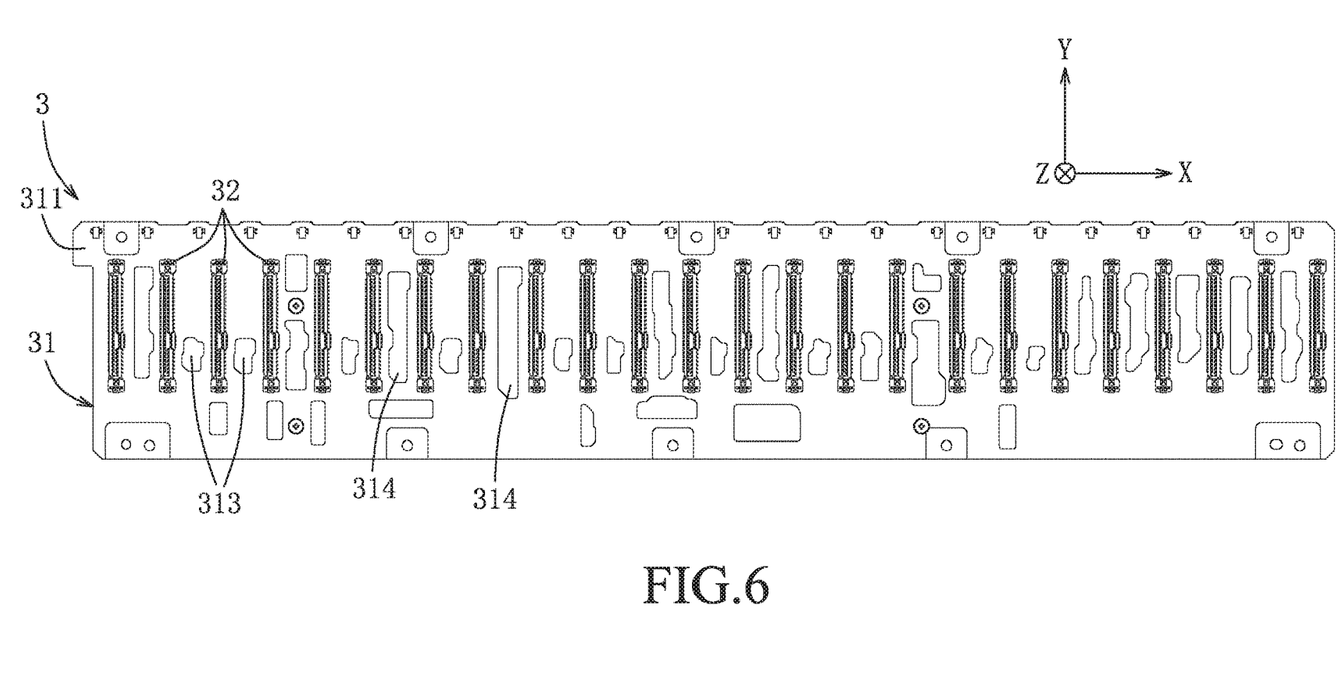
FIG. 6 is a front view of the adapter device, showing the first surface of the base circuit board and arrangement of a plurality of first connectors on the base circuit board.

The first connectors 32 are disposed on the first surface 311 of the base circuit board 31 along the first direction (X) and are electrically connected to the base circuit board 31. Each of the first connectors 32 extends along the second direction (Y). In this embodiment, each of the first connectors 32 is welded to the first surface 311 of the base circuit board 31.

Figure 5:
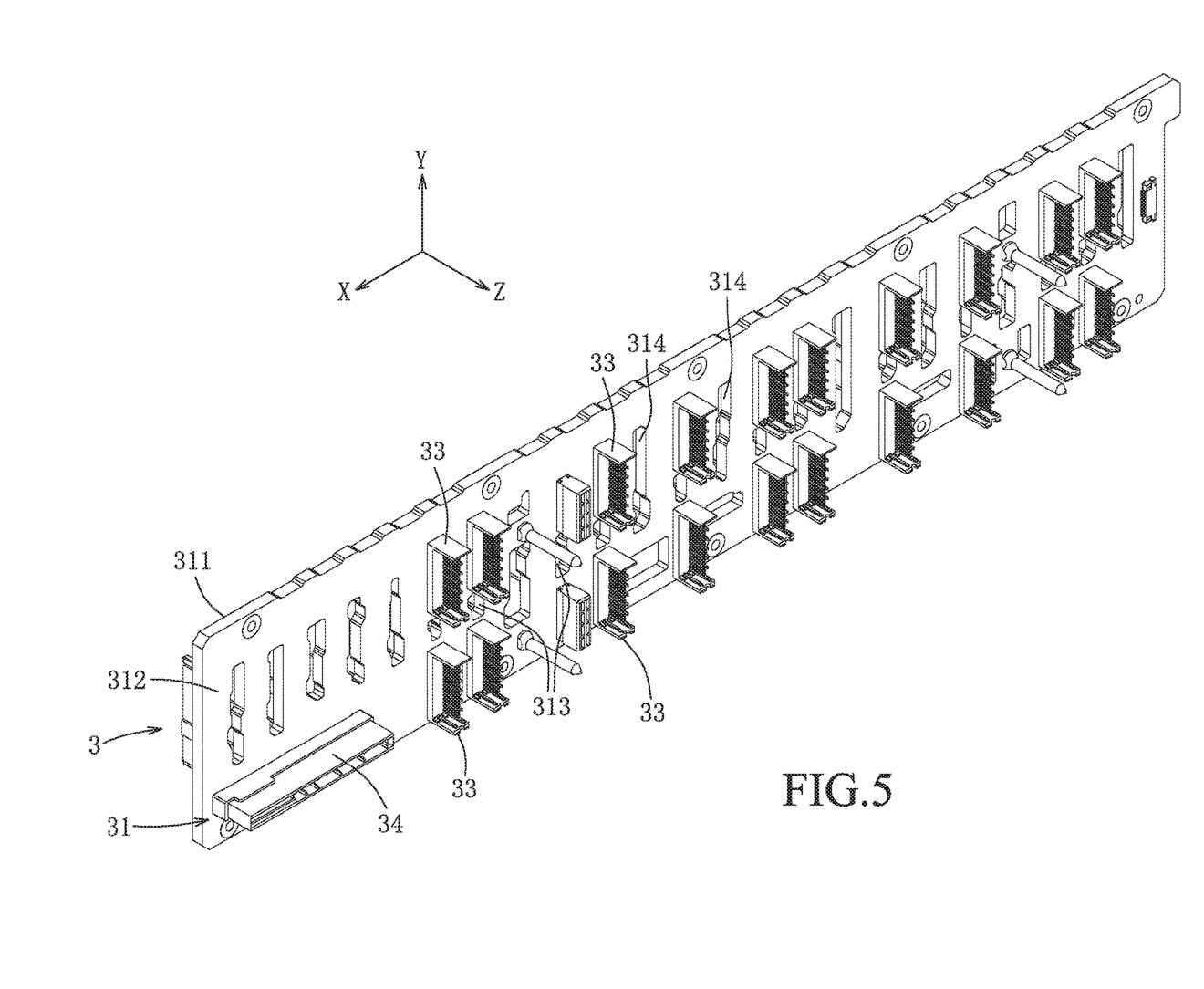
FIG. 5 is a rear perspective view of the adapter device, showing a second surface of the base circuit board opposite to the first surface.
Figure 7:
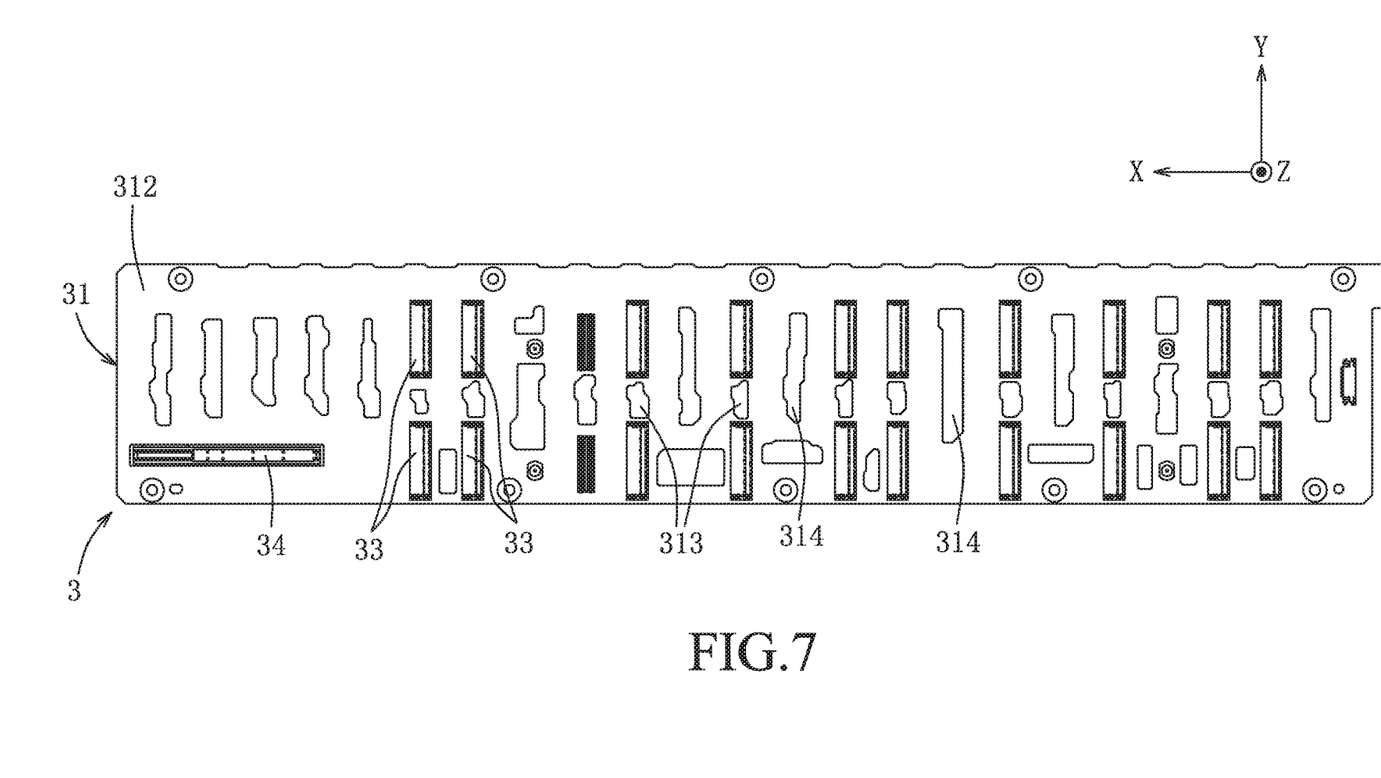
FIG. 7 is a rear view of the adapter device, showing the second surface of the base circuit board and arrangement of a plurality of second connectors on the base circuit board.

The second connectors 33 are arranged according to the position of the storage controller modules 2. Specifically, the second connectors 33 are disposed on the second surface 312 of the base circuit board 31 in pairs, and are spaced apart along the first direction (X). Each pair of the second connectors 33 is arranged along the second direction (Y), is electrically connected to the base circuit board 31 and is disposed between adjacent two of the first connectors 32. Moreover, each pair of the second connectors 33 has a positional correspondence of electrical connection. Specifically, in each pair of the second connectors 33, one of the second connectors 33 is located at an upper position and the other one of the second connectors 33 is located at a lower position. The upper second connector 33 is used for electrical connection with the storage controller module 2 located at the upper rack unit, and the lower second connector 33 is used for electrical connection with the storage controller module 2 located at the lower rack unit. Each of the storage modules 1 is electrically connected to a corresponding one of the first connectors 32. Each of the controllers 204 is electrically connected to a corresponding one of the second connectors 33, and is operable to control a corresponding one of the storage modules 1.

In this embodiment, each of the second connectors 33 is a narrow connector, and is welded to the second surface 312 of the base circuit board 31. As shown schematically in FIG. 8, the first connectors 32 and the second connectors 33 do not overlap in the third direction (Z).

Figure 8:
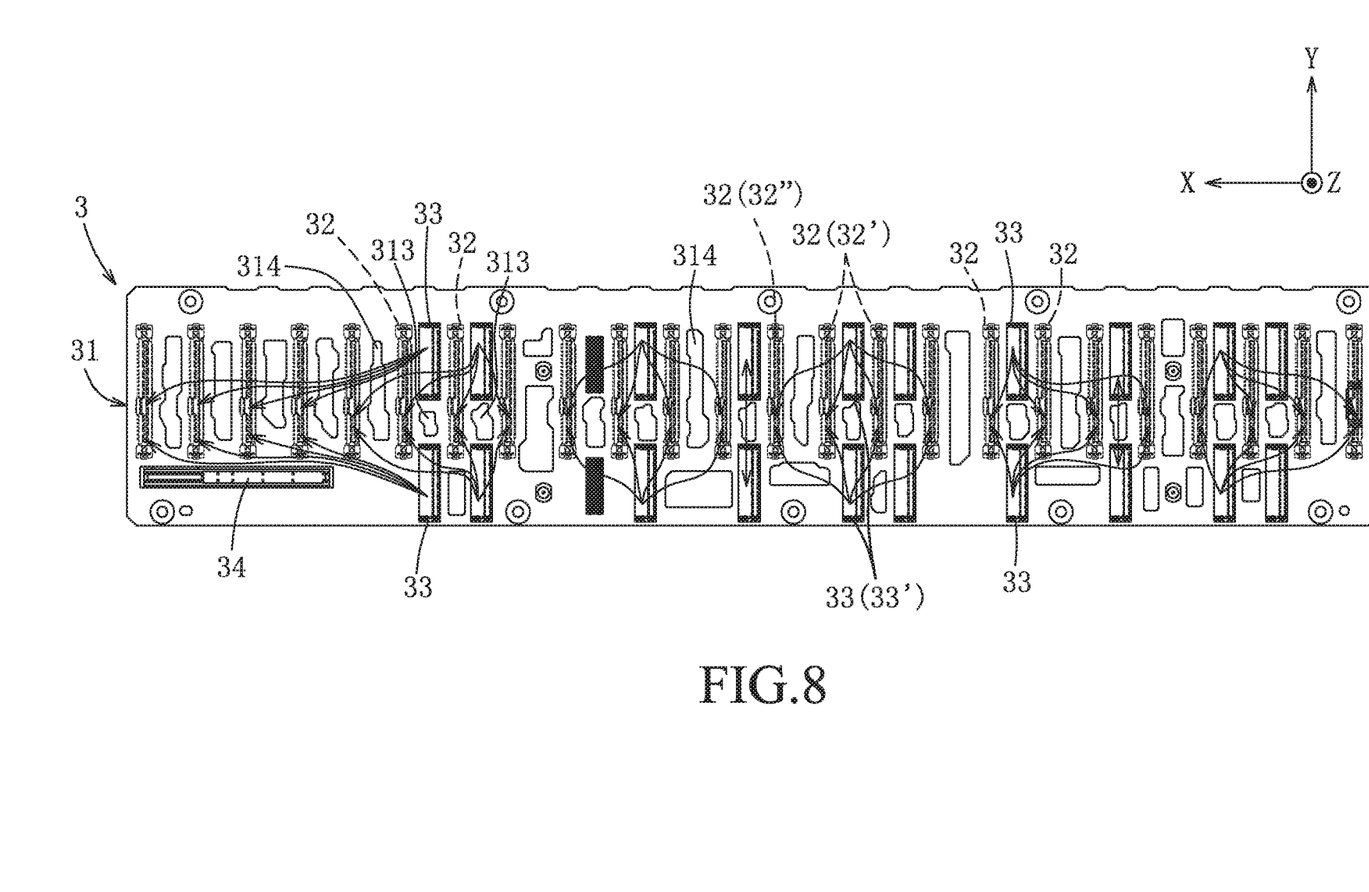
FIG. 8 is a schematic view of the adapter device, showing interconnection between the first and second connectors.

Referring to FIG. 8, at least a pair of the second connectors 33 (e.g., the second connectors 33') is electrically connected to the adjacent two of the first connectors 32 (e.g., the first connectors 32', which are respectively located at left and right sides of the at least a pair of the second connectors 33) through the base circuit board 31, and is further electrically connected through the base circuit board 31 to another two of the first connectors 32, which are disposed at one of the left and right sides of one of the adjacent two of the first connectors 32 (e.g., one of the first connector 32"). The electrical connection manner of the second connectors 33 and the first connectors 32 may be changed according to practical requirements. For example, in the leftmost pair of the second connectors 33 shown in FIG. 8, each of the second connectors 33 is electrically connected to the leftmost four first connectors 32. Through the abovementioned arrangement, the wires used to interconnect the upper second connectors 33 and the corresponding first connectors 32, and the wires used to interconnect the lower second connectors 33 and the corresponding first connectors 32 are separated from each other, thereby alleviating signal interference among the wires and reducing noise generation.

Figure 9:
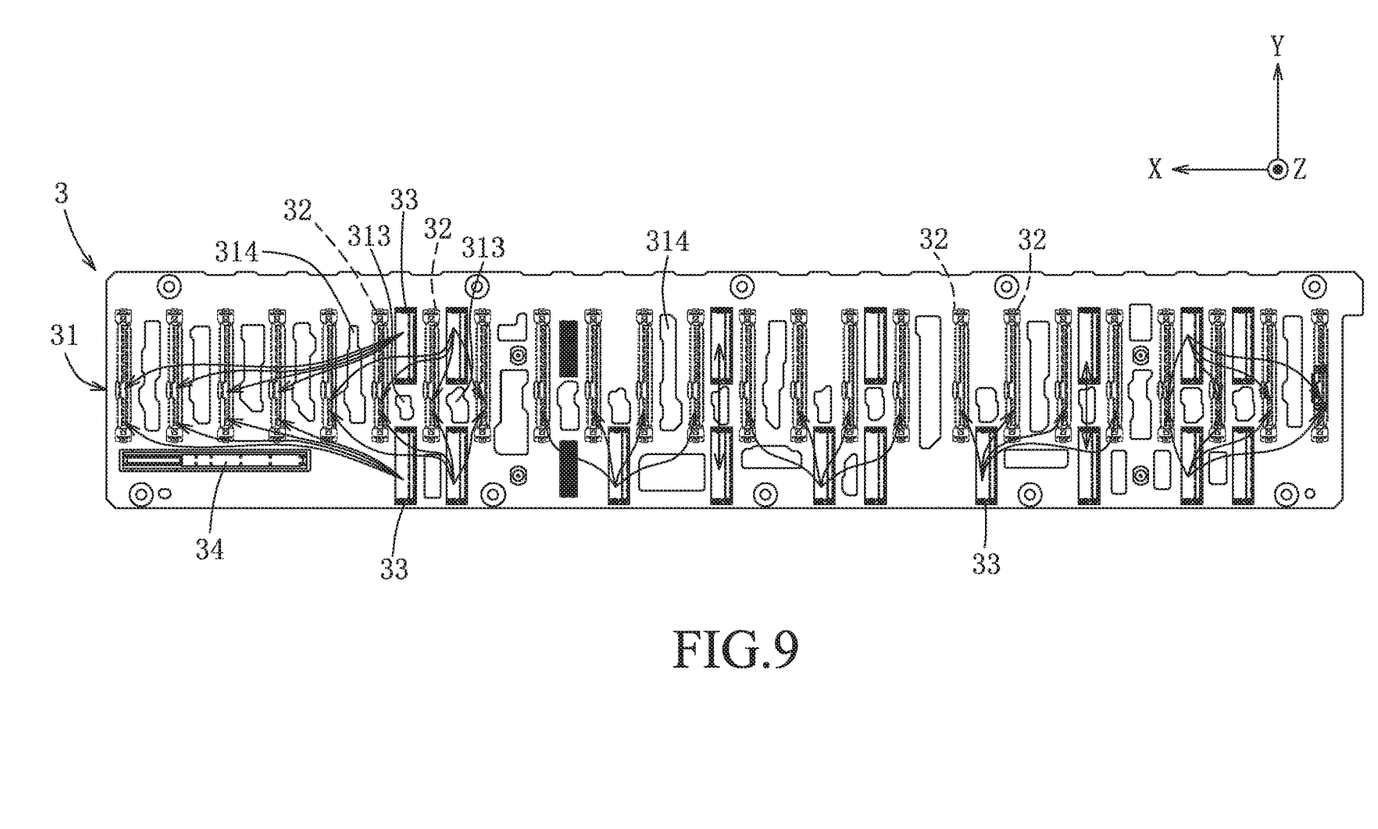
FIG. 9 is a schematic view of the adapter device, showing an alternative interconnection between the first and second connectors.

Referring to FIG. 9, alternatively, some of the second connectors 33 may be omitted according to practical requirements without impairing the reduction of noise generation.

Figure 10:
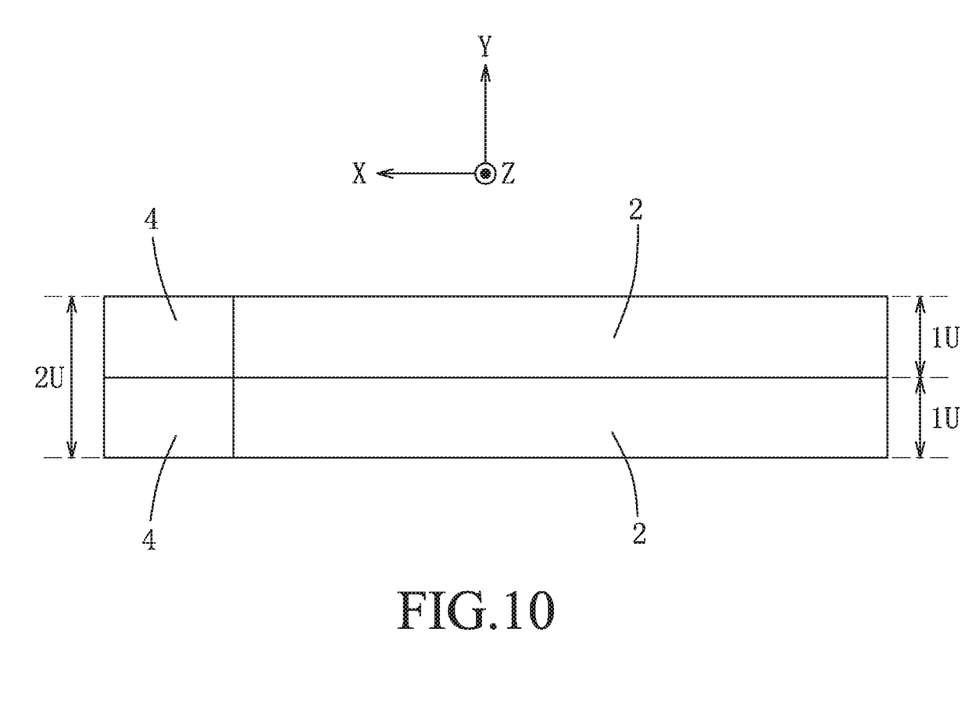
FIG. 10 is a schematic view of the embodiment, showing arrangement of storage controller modules and power modules in two rack units.

FIG. 10 is a schematic view showing arrangement of the storage controller modules 2 and the power modules 4 in the two rack units (2U). Specifically, each of the storage controller modules 2 and a corresponding one of the power modules 4 are arranged along the first direction (X) in a rack unit (1U), i.e., the abovementioned upper or lower rack unit. Such arrangement allows each of the storage controller modules 2 to be electrically connected to more storage modules 1, compared to an arrangement where the storage controller modules 2 are arranged side-by-side and each occupying the two rack units (2U).

Referring back to FIGS. 2 and 7, the first venting holes 313 are arranged along and spaced apart from each other in the first direction (X). Each of the first venting holes 313 is disposed between a corresponding pair of the second connectors 33. The second venting holes 314 are arranged along and spaced apart from each other in the first direction (X). Each of the second venting holes 314 is elongated along the second direction (Y). The first and second venting holes 313, 314 allow air to circulate around the storage modules 1 to improve heat dissipation of the storage modules 1. The power connector 34 is mounted to the second surface 312 of the base circuit board 31, is electrically connected to the base circuit board 31 and to the power expander board 5 (see FIG. 3).

In this embodiment, the adapter device 3 may be a printed circuit board assembly (PCBA), which is a circuit board mounted with electronic devices. The storage modules 1 may include a plurality of hard disk drives (HDDs) or a plurality of solid state drives (SSDs) such as NVMe SSDs. The power modules 4 may include a power supply unit (not shown) for supplying power to the storage modules 1 and the storage controller modules 2. The power expander board 5 may include a power distribution board (PDB) (not shown).

In the description above, for the purposes of explanation, numerous specific details have been set forth in order to provide a thorough understanding of the embodiment and variation. It will be apparent, however, to one skilled in the art, that one or more other embodiments may be practiced without some of these specific details. It should also be appreciated that reference throughout this specification to "one embodiment," "an embodiment," an embodiment with an indication of an ordinal number and so forth means that a particular feature, structure, or characteristic may be included in the practice of the disclosure. It should be further appreciated that in the description, various features are sometimes grouped together in a single embodiment, figure, or description thereof for the purpose of streamlining the disclosure and aiding in the understanding of various inventive aspects, and that one or more features or specific details from one embodiment may be practiced together with one or more features or specific details from another embodiment, where appropriate, in the practice of the disclosure.

While the disclosure has been described in connection with what are considered the exemplary embodiment and variation, it is understood that this disclosure is not limited to the disclosed embodiment and variation but is intended to cover various arrangements included within the spirit and scope of the broadest interpretation so as to encompass all such modifications and equivalent arrangements.

What is claimed is:

1. A server comprising:
an adapter device including
a base circuit board that extends along a first direction and that has a first surface and a second surface opposite to said first surface,
a plurality of spaced-apart first connectors that are disposed on said first surface along the first direction and that are electrically connected to said base circuit board, each of said first connectors extending along a second direction that is perpendicular to the first direction, and
a plurality of second connectors that are disposed on said second surface in pairs, which are spaced apart along the first direction, each pair of said second connectors being arranged along the second direction, being electrically connected to said base circuit board and being disposed between adjacent two of said first connectors;
a plurality of storage modules, each of which is electrically connected to a corresponding one of said first connectors; and
a plurality of controllers, each of which is electrically connected to a corresponding one of said second connectors and is operable to control a corresponding one of said storage modules.

2. The server as claimed in claim 1, wherein each of said second connectors is a narrow connector.

3. The server as claimed in claim 1, wherein said base circuit board further has a plurality of first venting holes, each of said first venting holes extending through said first surface and said second surface and being disposed between a corresponding pair of said second connectors.

4. The server as claimed in claim 3, wherein said base circuit board further has a plurality of second venting holes, each of said second venting holes extending through said first surface and said second surface, said second venting holes being elongated along the second direction and being spaced apart along the first direction.

5. The server as claimed in claim 1, further comprising a case, said storage modules and said controllers being received in said case.

6. The server as claimed in claim 5, wherein said adapter device is received in said case and is electrically connected to said controllers.

7. A server comprising:
a base circuit board having a front surface and a rear surface;
a plurality of spaced-apart first connectors disposed on said front surface of said base circuit board and electrically connected to said base circuit board;
a plurality of spaced-apart narrow connectors disposed on said rear surface of said base circuit board, each of said narrow connectors being disposed between adjacent two of said first connectors and being electrically connected to said base circuit board;
a case;
a plurality of storage modules received in said case, each of said storage modules being electrically connected to a corresponding one of said first connectors; and
a plurality of controllers received in said case, each of said controllers being electrically connected to a corresponding one of said narrow connectors and being operable to control a corresponding one of said storage modules.

8. The server as claimed in claim 7, wherein said adjacent two of said first connectors are respectively located at left and right sides of a corresponding one of said narrow connectors and are electrically connected to said narrow connector through said base circuit board, each of said narrow connectors being further electrically connected through said base circuit board to another two of said first connectors, both of which are disposed at one of the left and right sides of one of said adjacent two of said first connectors.

9. The server as claimed in claim 7, wherein said base circuit board further has a plurality of first venting holes, each of said first venting holes extending through said front surface and rear surface and being disposed between adjacent two of said narrow connectors.

10. The server as claimed in claim 9, wherein said base circuit board further has a plurality of second venting holes, each of said second venting holes extending through said front surface and said rear surface, said second venting holes being elongated and being spaced apart from each other.

11. The server as claimed in claim 7, wherein said narrow connectors are arranged in multiple pairs, said server further comprising two storage controller modules that are disposed one above the other in said case, each of said storage controller modules including at least one of said controllers.

12. The server as claimed in claim 11, wherein:
each pair of said narrow connectors are arranged one above the other; and
said storage controllers modules are electrically and respectively connected to said narrow connectors of each pair.

13. A server comprising:
a base circuit board having a front surface and a rear surface;
a plurality of first connectors spaced apart from each other on said front surface of said base circuit board and electrically connected to said base circuit board;
multiple pairs of second connectors, each pair of which is disposed on said rear surface of said base circuit board between adjacent two of said first connectors;
a case;
a plurality of storage modules received in said case, each of said storage modules being electrically connected to a corresponding one of said first connectors; and
a plurality of controllers received in said case, each of said controllers being electrically connected to a corresponding one of said second connectors and being operable to control a corresponding one of said storage modules,
wherein at least one pair of said second connectors is electrically connected to said adjacent two of said first connectors through said base circuit board.

14. The server as claimed in claim 13, wherein said adjacent two of said first connectors are respectively located at left and right sides of said at least one pair of said second connectors, said at least one pair of said second connectors being further electrically connected through said base circuit board to another two of said first connectors, both of which are disposed at one of the left and right sides of one of said adjacent two of said first connectors.

15. The server as claimed in claim 13, further comprising two storage controller modules that are disposed one above the other in said case, each of said storage controller modules including at least one of said controllers.

16. The server as claimed in claim 15, wherein:
each pair of said second connectors are arranged one above the other; and
said storage controller modules are electrically and respectively connected to said second connectors of each pair.

* * * * *